United States Patent
Kondo et al.

(10) Patent No.: US 8,671,837 B2
(45) Date of Patent: Mar. 18, 2014

(54) SQUEEGEE DEVICE AND SCREEN PRINTING MACHINE

(75) Inventors: Takeshi Kondo, Chiryu (JP); Akihiro Senga, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 393 days.

(21) Appl. No.: 12/955,434

(22) Filed: Nov. 29, 2010

(65) Prior Publication Data

US 2011/0132212 A1   Jun. 9, 2011

(30) Foreign Application Priority Data

Dec. 8, 2009   (JP) .................................. 2009-278719

(51) Int. Cl.
*B05C 17/04* (2006.01)
*B05C 3/02* (2006.01)

(52) U.S. Cl.
USPC .......................................... 101/123; 118/413

(58) Field of Classification Search
USPC .................. 101/114, 123, 129, 124; 118/413; 15/256.5, 256.51, 256.52
See application file for complete search history.

(56) References Cited

U.S. PATENT DOCUMENTS

| | | | | |
|---|---|---|---|---|
| 4,069,756 A | * | 1/1978 | Vertegaal | 101/120 |
| 4,102,266 A | * | 7/1978 | Porth | 101/124 |
| 4,995,316 A | * | 2/1991 | Kolblin et al. | 101/123 |
| 5,388,508 A | * | 2/1995 | Dubuit | 101/123 |
| 6,576,178 B2 | * | 6/2003 | Mizuno et al. | 264/272.14 |
| 7,032,513 B2 | * | 4/2006 | Onishi et al. | 101/425 |
| 7,331,285 B2 | * | 2/2008 | Steenkamer et al. | 101/120 |
| 7,503,255 B2 | * | 3/2009 | Weber et al. | 101/123 |

FOREIGN PATENT DOCUMENTS

| | | | |
|---|---|---|---|
| JP | A-08-039767 | | 2/1996 |
| JP | A-10-000757 | | 1/1998 |
| JP | A-10-157069 | | 6/1998 |
| JP | A-2001-047599 | | 2/2001 |
| JP | A-2003-048304 | | 2/2003 |
| JP | A-2006-315329 | | 11/2006 |
| JP | 2007015307 A | * | 1/2007 |

* cited by examiner

*Primary Examiner* — Ren Yan
(74) *Attorney, Agent, or Firm* — Oliff PLC

(57) ABSTRACT

A squeegee device includes a squeegee that has a sliding contact portion in sliding contact with a screen mask, and that prints a solder on a circuit board through the screen mask, wherein an attack angle of the squeegee is adjustable. In the squeegee device, when adjusting the attack angle during a tooling change in which the type of circuit board is changed, positions of the sliding contact portion before and after adjustment substantially match.

6 Claims, 11 Drawing Sheets

SQUEEGEE DEVICE AND SCREEN PRINTING MACHINE

INCORPORATION BY REFERENCE

The disclosure of Japanese Patent Application No. 2009-278719 filed on Dec. 8, 2009 including the specification, drawings and abstract is incorporated herein by reference in its entirety.

BACKGROUND OF THE INVENTION

1. Field of the Invention

The present invention relates to a squeegee device and a screen printing machine used to print a solder on a circuit board.

2. Description of the Related Art

A screen printing machine includes a squeegee device and a screen mask. The squeegee device is arranged above the screen mask. The squeegee device includes a device body, a squeegee holder, and a squeegee. The squeegee is mounted on the squeegee holder. The screen mask is formed with pattern holes. A solder is arranged on the upper surface of the screen mask. A circuit board is arranged below the screen mask.

When printing a solder on the circuit board, first, the device body is lowered and the squeegee is pressed into contact with the upper surface of the screen mask. Next, the device body is moved in a substantially horizontal direction with respect to the upper surface of the screen mask. The squeegee slides against the upper surface of the screen mask. The squeegee presses the solder into the pattern holes. The pressed solder is transferred onto the circuit board. Thus, the solder is printed on the circuit board by the squeegee. Therefore, an attack angle of the squeegee (a narrow angle between the screen mask upper surface and the squeegee) is an important parameter for securing printing quality. The attack angle of the squeegee is modified as appropriate when changing the type of circuit board on which to print a solder, that is, during a tooling change.

According to related art, the type of squeegee holder is changed when changing the attack angle of the squeegee. Specifically, a plurality of types of squeegee holders with different attachment angles with respect to the device body is prepared for the squeegee device in accordance with a plurality of types of attack angles.

However, after replacing the squeegee holder, the position of the lower end of the squeegee changes. During the printing operation, the lower end of the squeegee is in sliding contact with the screen mask. Therefore, the position of the squeegee lower end (horizontal position and vertical position) is extremely important. If the horizontal position of the squeegee lower end before and after replacing the squeegee holder differs, a start position and an end position both shift when the squeegee moves in the horizontal direction. Therefore, when performing the tooling change it is necessary to correct the start position and the end position. More specifically, the start position and the end position of the horizontal movement track of the device body need to be reset.

Also, if the vertical position of the squeegee lower end before and after replacing the squeegee holder differs, the pressing force of the squeegee on the screen mask changes. Therefore, when performing the tooling change it is necessary to correct the pressing force of the squeegee. More specifically, the amount the device body is lowered needs to be reset.

Thus, when adjusting the attack angle of the squeegee during the tooling change, it is necessary to replace the squeegee holder. Work to replace the squeegee holder is accompanied by a need to reset the horizontal movement track, the lowering amount, and the like of the device body.

Japanese Patent Application Publication No. JP-A-H10-157069 describes a screen printing machine that can adjust an attack angle of an oblique blade during the printing operation in order to automatically and constantly maintain a back pressure received by the oblique blade from a solder. Paragraph [0019] of JP-A-H10-157069 describes the oblique blade pivoting generally around a lower end thereof during the printing operation. Regarding this point, similar to the oblique blade during the printing operation, if the squeegee were also to pivot generally around a lower end thereof during the tooling change, the position of the lower end of the squeegee would generally not move.

However, the pivoting mechanism of the oblique blade described in JP-A-H10-157069 cannot be applied to the pivoting of the squeegee during the tooling change. This is because the pivoting of the oblique blade can only occur during the printing operation. In other words, during the printing operation, the lower end of the oblique blade is in sliding contact with the upper surface of the screen mask. In addition, a scraping squeegee is arranged rearward in the sliding direction of the lower end of the oblique blade. Meanwhile, a solder is arranged forward in the sliding direction of the lower end of the oblique blade. Therefore, advancement of the oblique blade is accompanied by the lower end of the oblique blade being pressed into a corner portion between the screen mask and the scraping squeegee. Accordingly, the oblique blade can pivot generally around the lower end thereof. Conversely, the oblique blade cannot pivot in a fixed track when the oblique blade is not pressed in contact with the upper surface of the screen mask, and when the oblique blade is not in contact with the solder.

Thus, the screen printing machine described in JP-A-H10-157069 is not provided with a member for securing the pivot track of the oblique blade. The pivoting mechanism of the oblique blade described in JP-A-H10-157069 is achieved on the presumption of a peripheral state of the oblique blade during the printing operation, and thus cannot be applied to the pivoting of the squeegee during the tooling change.

SUMMARY OF THE INVENTION

A squeegee device and a screen printing machine according to the present invention were accomplished in view of the foregoing issue. The present invention provides a squeegee device and a screen printing machine in which, during a tooling change, adjustment work for an attack angle of a squeegee and accompanying work can be easily performed.

(1) In order to resolve the issue described above, a squeegee device according to the present invention includes a squeegee with an adjustable attack angle, the squeegee having a sliding contact portion that is in sliding contact with a screen mask, and printing a solder on a circuit board through the screen mask. When adjusting the attack angle during a tooling change in which a type of the circuit board is changed, positions of the sliding contact portion before and after adjustment substantially match.

According to the squeegee device of the present invention, the attack angle of the squeegee can be adjusted during the tooling change instead of during the printing operation. Further, according to the squeegee device of the present invention, there is no need to perform replacement work for a squeegee holder when adjusting the attack angle. Therefore, adjustment work for the attack angle of the squeegee can be easily performed. Also, there is no need to prepare a plurality of types of parts depending on the plurality of attack angles, so the number of parts of the squeegee device can be reduced.

According to the squeegee device of the present invention, even in a state where the squeegee is separated from the screen mask, when adjusting the attack angle the position of the sliding contact portion of the squeegee (i.e., a lower end of the squeegee as one example) does not substantially change before and after adjustment. Accordingly, there is no need to reset the horizontal movement track, lowering amount, and the like of the squeegee device, compared to a case in which the position of the sliding contact portion of the squeegee changes before and after adjustment. Therefore, work accompanying the adjustment work for the attack angle of the squeegee can be easily performed.

(1-1) In the configuration of (1) above, the squeegee is preferably arranged as a pair facing each other in a substantially horizontal direction. The present configuration relates to a so-called double squeegee type of squeegee device.

When adjusting the attack angle, if the position of the sliding contact portion of the squeegee in the horizontal direction changes before and after adjustment, the interval between the pair of sliding contact portions changes. Therefore, the horizontal movement track of the squeegee device must be reset. Regarding this point, according to the present configuration, even if the attack angle is adjusted, the position of the sliding contact portion of the squeegee in the horizontal direction does not change before and after adjustment. Consequently, it is not necessary to reset the horizontal movement track of the squeegee device. Therefore, work accompanying the adjustment work for the attack angle of the squeegee can be easily performed.

(2) In the configuration of (1) above, the squeegee device preferably further includes a pivot member that holds the squeegee and has a guided portion; a fixed member that has a guide portion that guides the guided portion in an arc-like track generally centered around the sliding contact portion of the squeegee; and a lifting/lowering member that can lift and lower the pivot member and the fixed member.

When adjusting the attack angle of the squeegee, in order to ensure that the positions of the sliding contact portion substantially match before and after adjustment, the squeegee may pivot generally centered around the sliding contact portion (however, the configuration of (1) above is not limited to this mode).

Here, to pivot the squeegee generally centered around the sliding contact portion, a pivot shaft (for example, a shaft member or a boss member) serving as the pivot center of the squeegee may be disposed on the sliding contact portion. However, during the printing operation, the sliding contact portion is in sliding contact with the screen mask. Therefore, it is difficult to dispose the pivot shaft on the sliding contact portion.

Regarding this point, according to the present configuration, by using the guide portion to guide the guided portion, the squeegee can be pivoted generally around the sliding contact portion. Therefore, it is not necessary to dispose the pivot shaft on the sliding contact portion.

In the case of the screen printing machine according to JP-A-H10-157069, the attack angle of the squeegee is adjusted by using an actuator to push/pull the upper end of the squeegee. Therefore, the pressing force of the squeegee on the solder and the screen mask, and the attack angle of the squeegee can not be independently adjusted.

On the contrary, according to the present configuration, the position of the squeegee in the vertical direction, that is, the pressing force of the squeegee on the screen mask and the solder, can be adjusted by the lifting/lowering member. In addition, the attack angle of the squeegee can be adjusted by the guide portion and the guided portion. Therefore, the pressing force of the squeegee and the attack angle of the squeegee can be independently adjusted.

A plurality of attack angles can be achieved with a single pivot member. There is thus no need to prepare a plurality of types of pivot members depending on the plurality of attack angles. This reduces the number of parts of the squeegee device accordingly.

(3) In the configuration of (2) above, at least one among the pivot member and the fixed member preferably has a scale that directly or indirectly shows the attack angle. According to the present configuration, compared to having no scale, the operator can easily confirm the attack angle of the squeegee even if the squeegee is separated from the screen mask.

(3-1) In the configuration of (3) above, the scale is disposed on an upper surface of the guided portion. The upper surface of the guided portion can be easily seen by the operator. Therefore, according to the present configuration, the operator can even more easily confirm the attack angle of the squeegee.

(4) In the configuration of (2) or (3) above, the squeegee device preferably further includes a paste doctor blade that is disposed on the fixed member, and during printing suppresses spreading out of the solder to an outer side from both ends of the squeegee in a lengthwise direction.

The paste doctor blade is conventionally disposed on the squeegee holder, which is a replacement part. Therefore, when changing the attack angle of the squeegee, that is, when changing the type of squeegee holder, the inclination angle of the paste doctor blade with respect to the screen mask changes. Consequently, it is necessary to also change the type of paste doctor blade when changing the type of squeegee holder, in order to ensure a predetermined inclination angle.

Regarding this point, according to the present configuration, the paste doctor blade is disposed on the fixed member. Even if the attack angle of the squeegee changes, the angle of the fixed member stays the same. Thus, even if the attack angle of the squeegee is changed during the tooling change, there is no need to change the type of paste doctor blade. Alternatively, there is no need to adjust the inclination angle of the paste doctor blade.

(5) In the configuration of any one of (2) to (4) above, the guide portion preferably has an outer guide piece that guides the guided portion from a radial outer side, and an inner guide piece that guides the guided portion from a radial inner side, generally centered around the sliding contact portion of the squeegee.

According to the present configuration, the guided portion is guided by the outer guide piece and the inner guide piece from both radial inner and outer sides of the track of the guided portion. Therefore, the track of the guided portion is easy to stabilize when changing the attack angle of the squeegee.

(6) In order to resolve the issue described above, a screen printing machine according to the present invention includes a squeegee device having the configuration of any one of (1) to (5) above. According to the screen printing machine of the present invention, during a tooling change, the adjustment work for the attack angle of the squeegee and accompanying work can be easily performed.

According to the present invention, a squeegee device and a screen printing machine can be provided in which, during a tooling change, adjustment work for an attack angle of a squeegee and accompanying work can be easily performed.

DETAILED DESCRIPTION OF THE EMBODIMENTS

Hereinafter, embodiments of a squeegee device and a screen printing machine according to the present invention will be described.
<<First Embodiment>>
[Constitution of Screen Printing Machine]

Figure 1:
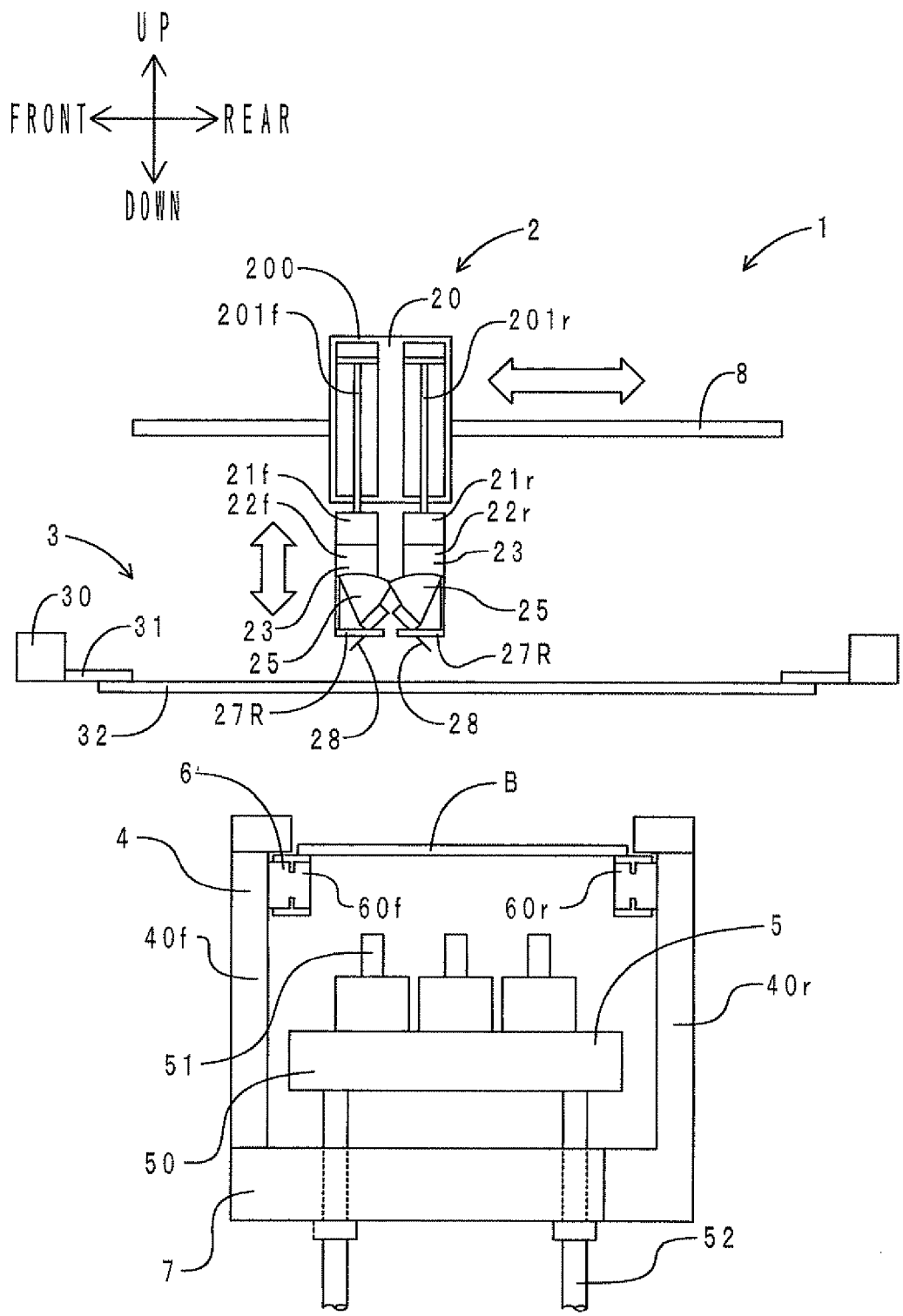
FIG. 1 is a right side view of a screen printing machine according to a first embodiment.

First, the constitution of the screen printing machine according to the present embodiment will be described. FIG. 1 shows a right side view of the screen printing machine according to the present embodiment. As illustrated in FIG. 1, a screen printing machine 1 of the present embodiment includes a squeegee device 2, a mask device 3, a clamp device 4, a back-up device 5, a transfer device 6, a main table 7, and a y-axis guide rail 8.

Note that with respect to the reference numerals below, "f" indicates front, "r" indicates rear, "L" indicates left, and "R" indicates right. For example, "XX(number)f" and "XXr" indicate members that face each other in the front-rear direction. In addition, "XXL" and "XXR" indicate members that face each other in the left-right direction.
(Main Table 7, Clamp Device 4)

The main table 7 has the shape of a rectangular plate. The main table 7 can move in the up-down direction.

The clamp device 4 includes a fixed clamp 40f and a movable clamp 40r. The fixed clamp 40f has the shape of a rectangular plate. The fixed clamp 40f is provided standing upright from the front edge of the main table 7. The movable clamp 40r has the shape of a rectangular plate. The movable clamp 40r is provided standing upright from the rear edge of the main table 7. The fixed clamp 40f and the movable clamp 40r face each other in the front-rear direction. The movable clamp 40r can move in the front-rear direction.
{Transfer Device 6}

The transfer device 6 includes a pair of conveyor belts 60f, 60r. The conveyor belt 60f is disposed on the upper edge of the rear surface of the fixed clamp 40f. The conveyor belt 60f extends in the left-right direction. The conveyor belt 60r is disposed on the upper edge of the front surface of the movable clamp 40r. The conveyor belt 60r extends in the left-right direction. The pair of conveyor belts 60f, 60r face each other in the front-rear direction. A circuit board 13 is provided bridging the pair of conveyor belts 60f, 60r. The circuit board B is transferred from the left side (upstream side) to the right side (downstream side) by the pair of conveyor belts 60f, 60r.

{Back-Up Device 5}

The back-up device 5 includes a back-up table 50, a plurality of back-up pins 51, and a pair of guide rods 52. The back-up table 50 has the shape of a rectangular plate. The back-up table 50 is arranged above the main table 7. The back-up table 50 is disposed between the fixed clamp 40f and the movable clamp 40r. The pair of guide rods 52 support the lower surface of the back-up table 50 movable in the up-down direction. The plurality of back-up pins 51 is arranged on the upper surface of the back-up table 50.
{Mask Device 3}

The mask device 3 includes a frame 30, a mesh 31, and a screen mask 32. The mask device 3 is arranged above the clamp device 4. The frame 30 has the shape of a rectangular frame. The mesh 31 has the shape of a rectangular frame. The mesh 31 is arranged within the frame 30. The screen mask 32 has the shape of a thin rectangular plate. The screen mask 32 is provided stretched on the mesh 31. The screen mask 32 is formed with a plurality of pattern holes (not shown). The pattern holes are arranged in a predetermined pattern depending on the printing position of the circuit board B.
{Squeegee Device 2, Y-Axis Guide Rail 8}

The y-axis guide rail 8 is arranged above the mask device 3. The y-axis guide rail 8 extends in the front-rear direction.

The squeegee device 2 is a so-called double squeegee type of squeegee device 2. The squeegee device 2 includes an air cylinder 20, a front coupling member 21f, a rear coupling member 21r, a front unit 22f, and a rear unit 22r. The air cylinder 20 is included in the concept of a lifting/lowering member of the present invention.
(Air Cylinder 20)

The air cylinder 20 is disposed slidable in the front-rear direction on the y-axis guide rail 8. Therefore, the squeegee device 2 can move in the front-rear direction. The air cylinder 20 includes a cylinder body 200, a front piston 201f, and a rear piston 201r. The front piston 201f and the rear piston 201r are arranged in series in the front-rear direction. The front piston 201f and the rear piston 201r can each independently enter and exit the cylinder body 200.
(Front Coupling Member 21f, Rear Coupling Member 21r)

The front coupling member 21f is attached to the lower end of the front piston 201f. The front coupling member 21f has the shape of a rectangular column that is long in the left-right direction. The rear coupling member 21r is attached to the lower end of the rear piston 201r. The rear coupling member 21r has the shape of a rectangular column that is long in the left-right direction.
(Front Unit 22f, Rear Unit 22r)

Figure 2:
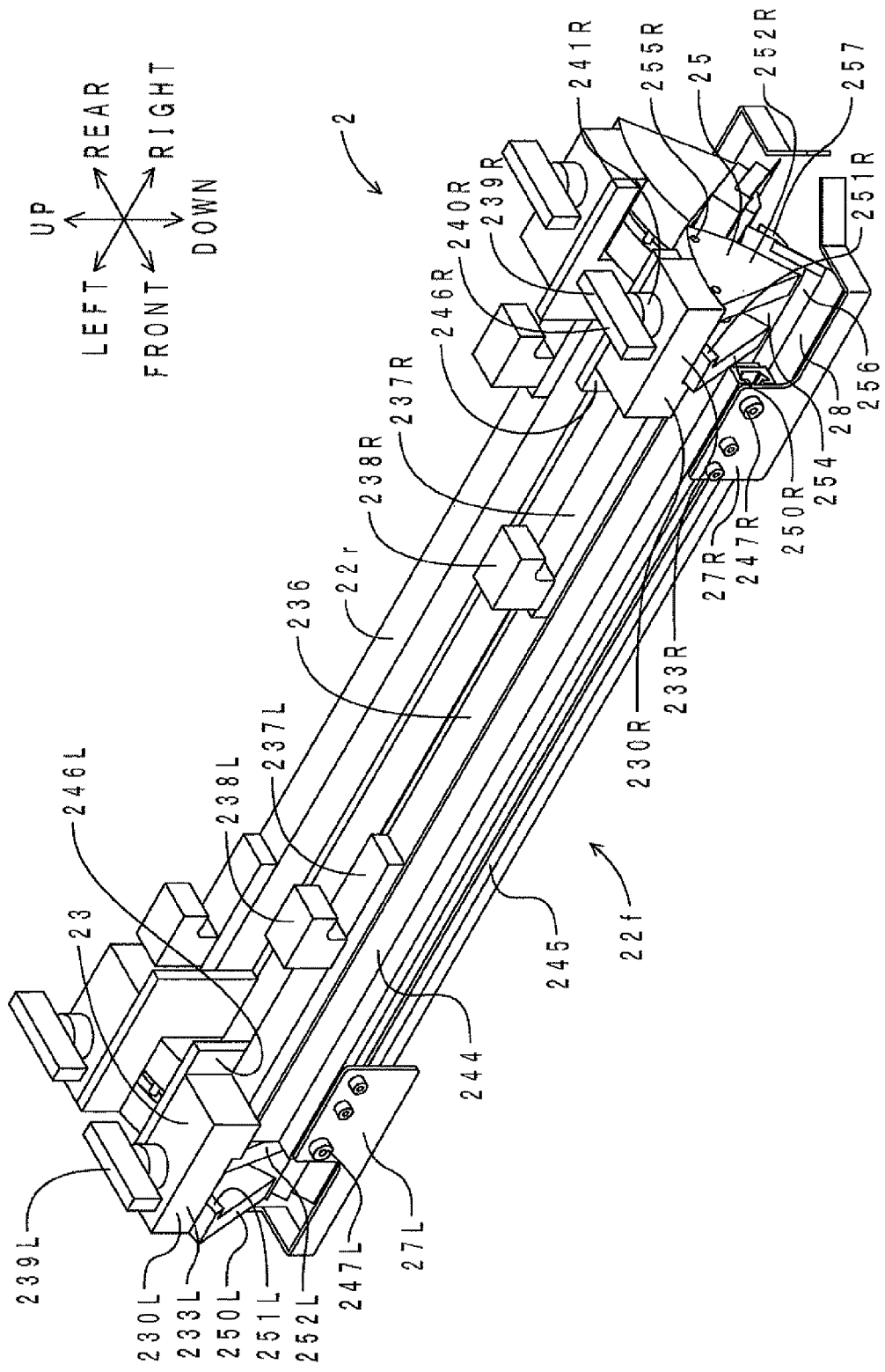
FIG. 2 is a perspective view of a front unit and a rear unit in a squeegee device of the screen printing machine.
Figure 3:
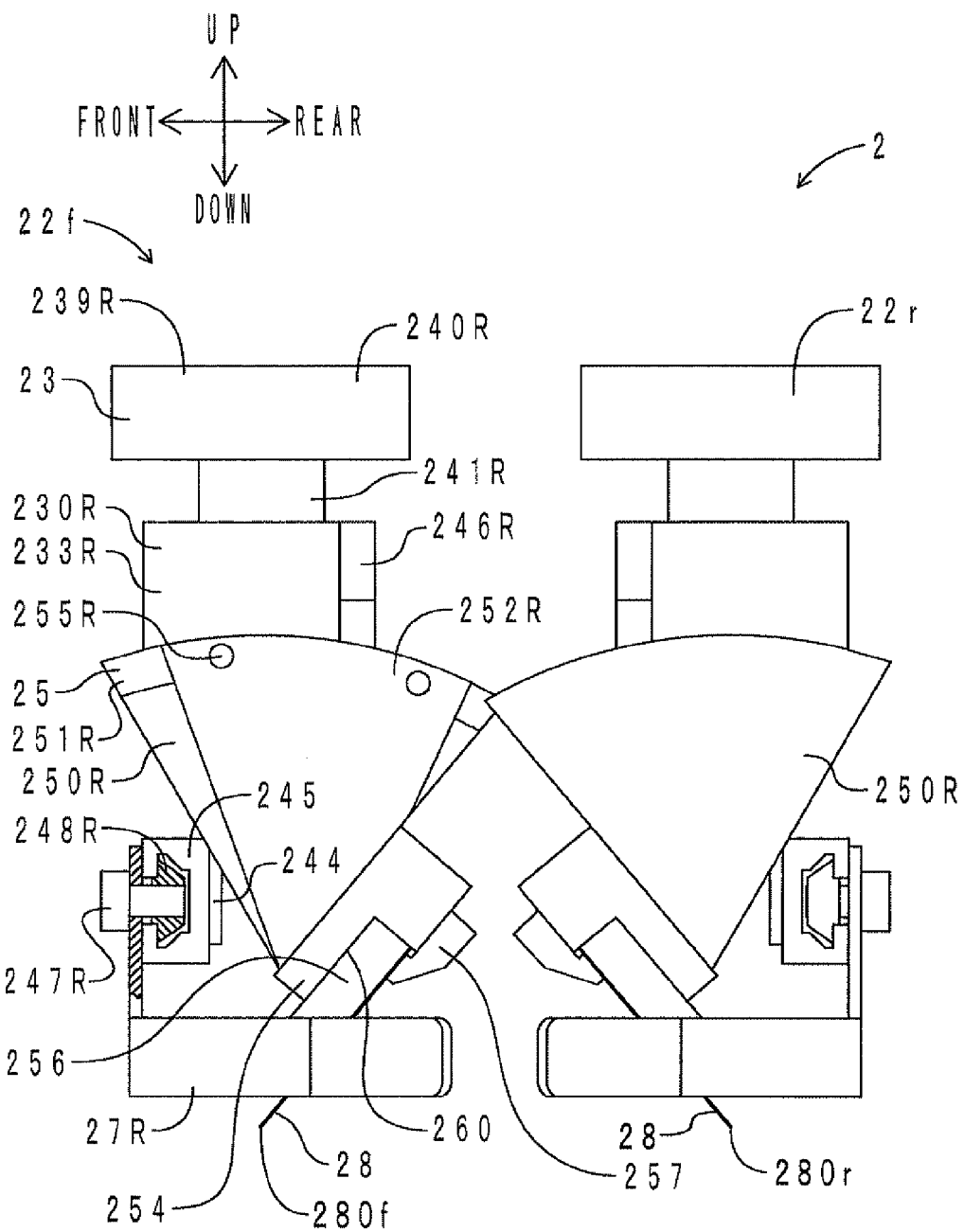
FIG. 3 is a right side view of the front unit and the rear unit.
Figure 4:
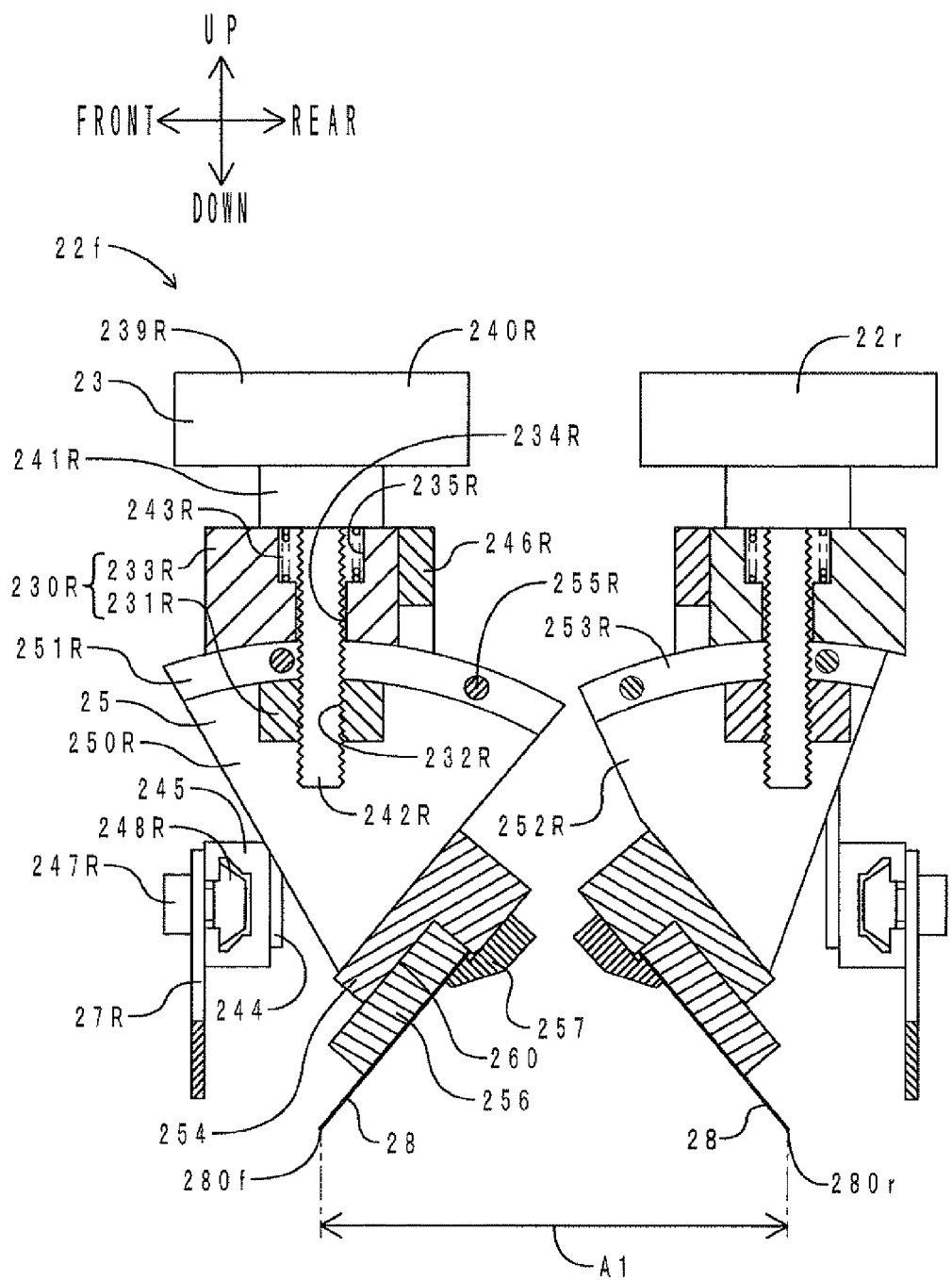
FIG. 4 is a cross-sectional view of the front unit and the rear unit as seen from the right side.

The front unit 22f is attached below the front coupling member 21f. The rear unit 22r is attached below the rear coupling member 21r. FIG. 2 shows a perspective view of the front unit and the rear unit in the squeegee device of the screen printing machine according to the present embodiment. FIG. 3 shows a right side view of the front unit and the rear unit. FIG. 4 shows a cross-sectional view of the front unit and the rear unit as seen from the right side. Note that, in FIG. 3, cross sections of a portion of a paste doctor blade 27R and a nut 248R are shown. The cross section of FIG. 4 is a cross section along a bolt member 239R that will be described later.

As illustrated in FIGS. 2 to 4, the front unit 22f and the rear unit 22r have substantially matching configurations, except for the positional relationship in the left-right direction of large guided members 250L, 250R and small guided members 252L, 252R, the left-right direction length of coupling pieces 237L, 237R, and the arrangement of attachment hooks 238L, 238R. Therefore, the description below mainly concerns only the constitution of the front unit 22*f*, but also serves to explain the constitution of the rear unit 22*r*.

Figure 5:
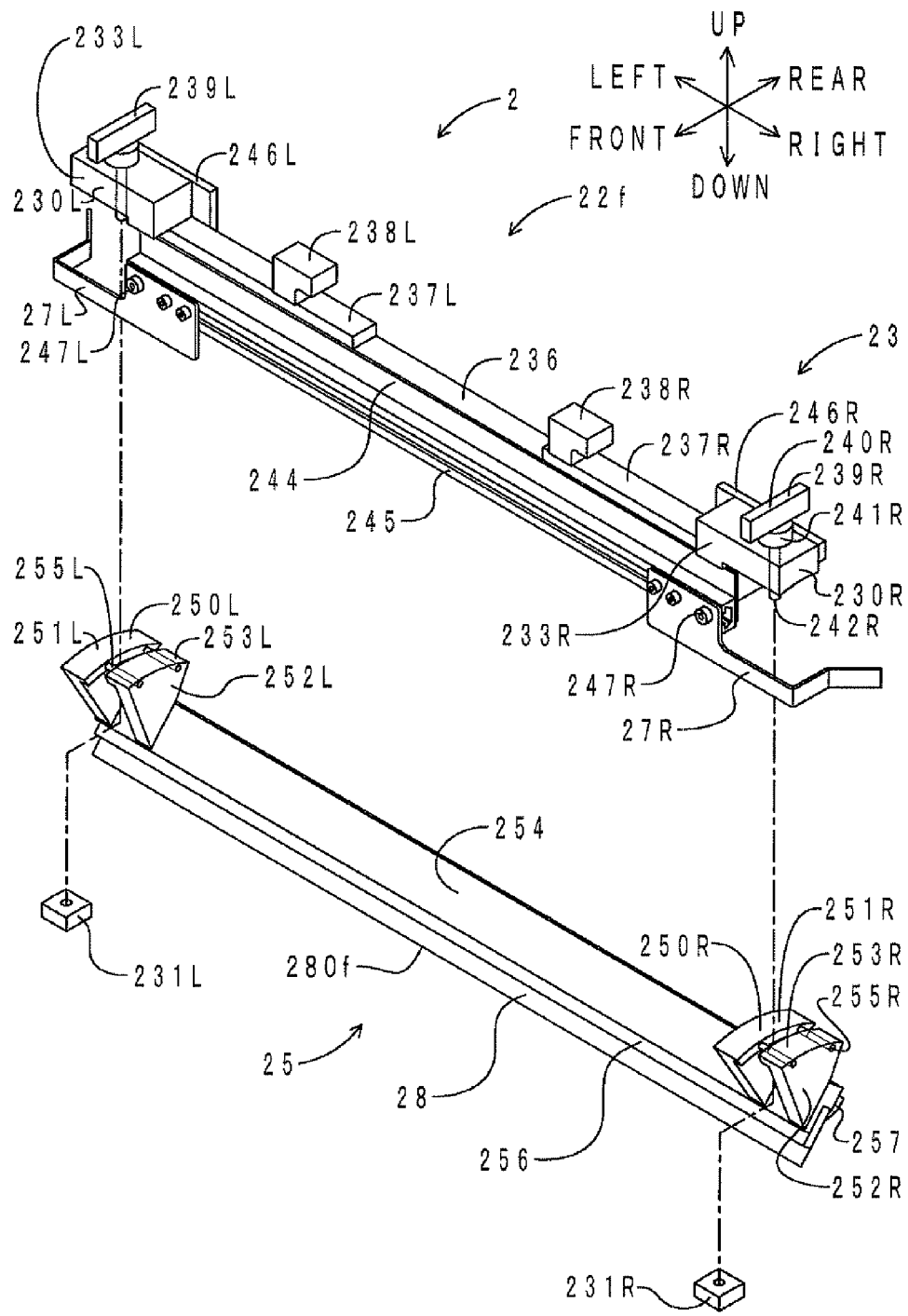
FIG. 5 is an exploded perspective view of the front unit.
Figure 6:
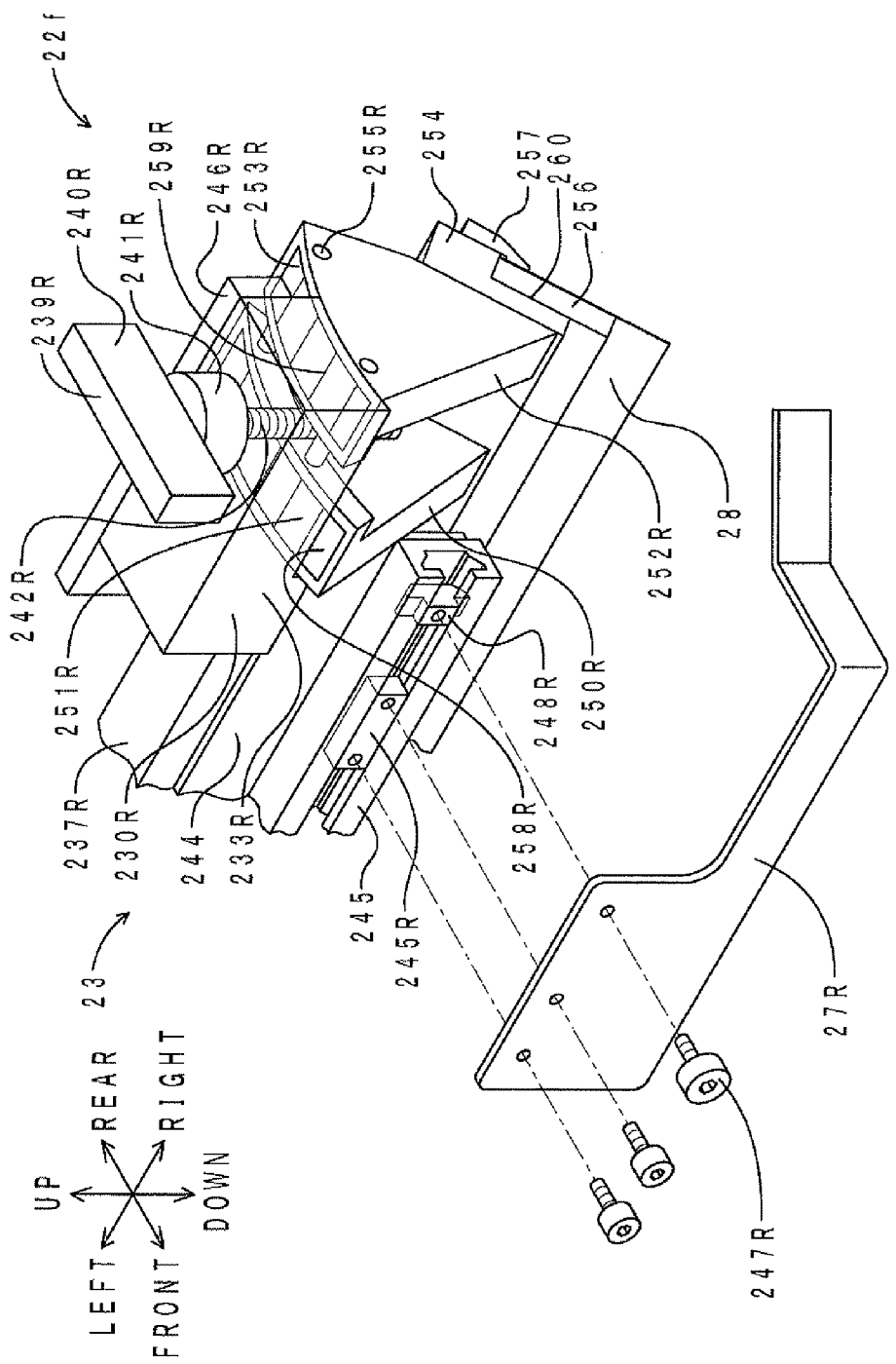
FIG. 6 is a perspective view of the vicinity of a right end portion of the front unit.
Figure 7:
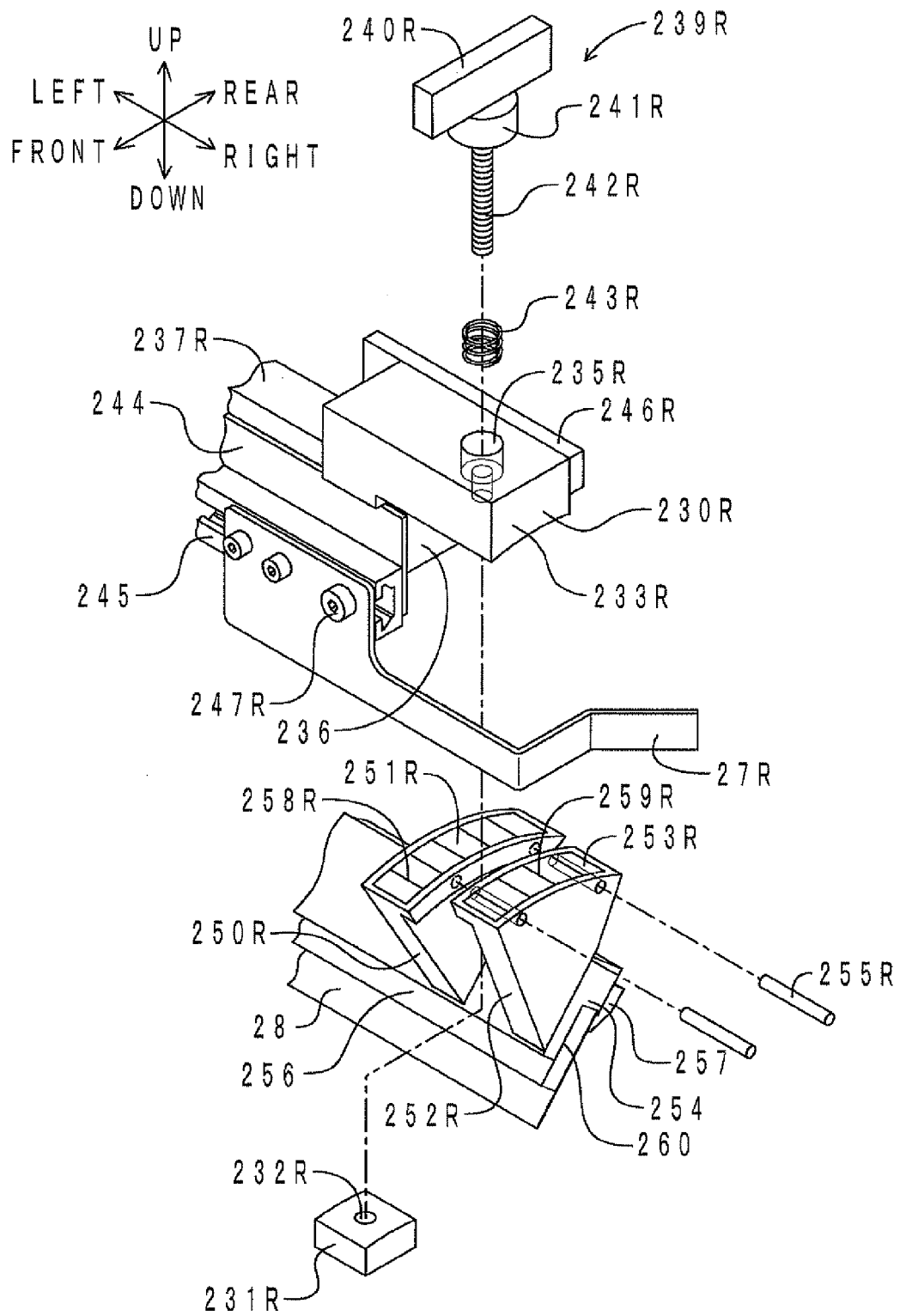
FIG. 7 is an exploded perspective view of the vicinity of the right end portion.

FIG. 5 shows an exploded perspective view of the front unit in the squeegee device of the screen printing machine according to the present embodiment. FIG. 6 shows a perspective view of the vicinity of the right end portion of the front unit. FIG. 7 shows an exploded perspective view of the vicinity of the right end portion. Note that, in FIG. 5, outer guide pieces 233L, 233R and the small guided members 252L, 252R are shown transparent. The outer guide piece 233R is also shown transparent in FIG. 6. Further, in FIG. 6, the paste doctor blade 27R is shown detached from a doctor attachment rail 245. As illustrated in FIGS. 1 to 7, the front unit 22*f* includes a fixed member 23, a pivot member 25, a pair of left and right paste doctor blades 27L, 27R, and a squeegee 28.

<Fixed Member 23>

The fixed member 23 is arranged below the front coupling member 21*f*. The fixed member 23 includes: a pair of left and right guide portions 230L, 230R; a fixed-side base member 236; the pair of left and right coupling pieces 237L, 237R; the pair of left and right attachment hooks 238L, 238R; a pair of left and right bolt members 239L, 239R; a pair of left and right coil springs 243R; a rail attachment bracket 244; the doctor attachment rail 245; a pair of left and right guide piece attachment brackets 246L, 246R; a total of six bolts 247L, 247R; a pair of left and right nuts 248R; and a pair of left and right guide members 245R.

As illustrated mainly in FIG. 5, the fixed-side base member 236 is made of metal and has the shape of a rectangular column. The fixed-side base member 236 extends in the left-right direction.

Each of the pair of coupling pieces 237L, 237R is made of metal and has the shape of a narrow plate. The pair of coupling pieces 237L, 237R are disposed on the upper surface of the fixed-side base member 236. The pair of coupling pieces 237L, 237R are also arranged spaced in the left-right direction.

Each of the pair of attachment hooks 238L, 238R is made of metal and has a hook-like shape. The attachment hook 238L is disposed on the upper surface of the coupling piece 237L. The attachment hook 238R is disposed on the upper surface of the coupling piece 237R. A pair of left and right engaged portions (not shown) is disposed on the lower surface of the front coupling member 21*f* shown in FIG. 1. The pair of attachment hooks 238L, 238R is engaged with the pair of engaged portions. Such engagement enables attachment of the fixed member 23, that is, the front unit 22*f*, to the front coupling member 21*f*.

As illustrated mainly in FIGS. 4 and 7, the guide portion 230R includes an inner guide piece 231R and the outer guide piece 233R. The outer guide piece 233R is made of metal and has the shape of a rectangular parallelepiped. The outer guide piece 233R projects rightward from the right end of the upper surface of the coupling piece 237R. As illustrated in FIG. 4, the lower surface of the outer guide piece 233R is shaped as an arc surface (shaped as a curved surface that recesses upward) whose general center is a lower end 280*f* of the squeegee 28. Lower ends 280*f*, 280*r* of the squeegees 28 are included in the concept of a sliding contact portion of the present invention. The outer guide piece 233R includes an axial insertion hole 234R and a spring-accommodating concave portion 235R. The spring-accommodating concave portion 235R is provided recessed on the upper surface of the outer guide piece 233R. The axial insertion hole 234R runs through the bottom surface of the spring-accommodating concave portion 235R and the lower surface of the outer guide piece 233R. The inner guide piece 231R is made of metal and has the shape of a rectangular parallelepiped. The inner guide piece 231R is arranged below the outer guide piece 233R. As illustrated in FIG. 4, the upper surface of the inner guide piece 231R is shaped as an arc surface (shaped as a curved surface that projects upward) whose general center is the lower end 280*f* of the squeegee 28. The inner guide piece 231R includes an axial insertion hole 232R. The axial insertion hole 232R runs through the inner guide piece 231R in the up-down direction. The constitution of the guide portion 230L is similar to the constitution of the guide portion 230R. The layout of the guide portion 230L is generally symmetrical in the left-right direction to the layout of the guide portion 230R. Thus, a description of the guide portion 230L will not be included here.

As illustrated mainly in FIGS. 4, 6, and 7, the guide piece attachment bracket 246R is made of metal and has the shape of a letter L. The guide piece attachment bracket 246R is rearwardly connected to the fixed-side base member 236, the coupling piece 237R, and the outer guide piece 233R. The constitution of the guide piece attachment bracket 246L is similar to the constitution of the guide piece attachment bracket 246R. The layout of the guide piece attachment bracket 246L is generally symmetrical in the left-right direction to the layout of the guide piece attachment bracket 246R. Thus, a description of the guide piece attachment bracket 246L will not be included here.

As illustrated mainly in FIGS. 4, 6, and 7, the bolt member 239R includes a knob 240R, a head portion 241R, and an axial portion 242R. The axial portion 242R has the shape of a round bar. The axial portion 242R is inserted into the spring-accommodating concave portion 235R and the axial insertion hole 234R. The lower end of the axial portion 242R is screwed to the axial insertion hole 232R of the inner guide piece 231R. The head portion 241R has the shape of a cylinder with a short axis. The head portion 241R is disposed on the upper end of the axial portion 242R. The head portion 241R projects from the upper surface of the outer guide piece 233R. The knob 240R has the shape of a narrow plate. The knob 240R is disposed on the upper surface of the head portion 241R. The constitution of the bolt member 239L is similar to the constitution of the bolt member 239R. The layout of the bolt member 239L is generally symmetrical in the left-right direction to the layout of the bolt member 239R. Thus, a description of the bolt member 239L will not be included here.

As illustrated mainly in FIGS. 4 and 7, the coil spring 243R is accommodated in the spring-accommodating concave portion 235R. The coil spring 243R is compressed in the up-down direction between the lower surface of the head portion 241R and the bottom surface of the spring-accommodating concave portion 235R. In other words, the coil spring 243R is storing a biasing force. The constitution of the coil spring on the left side (not shown) is similar to the constitution of the coil spring 243R. The layout of the coil spring on the left side is generally symmetrical in the left-right direction to the layout of the coil spring 243R. Thus, a description of the coil spring on the left side will not be included here.

As illustrated mainly in FIGS. 2 and 5, the rail attachment bracket 244 is made of metal and has the shape of a narrow plate. The rail attachment bracket 244 is disposed on the front surface of the fixed-side base member 236. The rail attachment bracket 244 extends in the left-right direction. The rail attachment bracket 244 projects downward of the fixed-side base member 236.

As illustrated mainly in FIGS. 2 and 5, the doctor attachment rail 245 is made of metal and has the shape of a rectangular tube with a C-shaped cross section. The doctor attachment rail 245 is disposed on the lower edge of the front surface of the rail attachment bracket 244. The doctor attachment rail 245 extends in the left-right direction.

<Paste Doctor Blades 27L, 27R>

As illustrated mainly in FIGS. 3, 5, and 6, the paste doctor blade 27R is made of metal and has the shape of a letter L. Among the three bolts 247R, the rightmost bolt 247R is fastened to the nut 248R so that the paste doctor blade 27R is attached to the right end of the front surface of the doctor attachment rail 245. The paste doctor blade 27R projects rightward from the right end of the doctor attachment rail 245 and curves rearward.

The two remaining bolts 247R among the three bolts 247R are attached to the guide member 245R. Loosening the fastening force of the bolt 247R (rightmost bolt 247R) with respect to the nut 248R enables movement of the guide member 245R, that is, the paste doctor blade 27R, in the left-right direction along the doctor attachment rail 245. Therefore, the attachment position of the paste doctor blade 27R on the doctor attachment rail 245 can be adjusted as appropriate.

The constitution of the paste doctor blade 27L is similar to the constitution of the paste doctor blade 27R. The layout of the paste doctor blade 27L is generally symmetrical in the left-right direction to the layout of the paste doctor blade 27R. Thus, a description of the paste doctor blade 27L will not be included here. The paste doctor blade 27L is attached to the left end of the front surface of the doctor attachment rail 245 by the leftmost bolt 247L and a nut (not shown). The paste doctor blade 27L can also move in the left-right direction along the doctor attachment rail 245.

<Pivot Member 25>

As illustrated mainly in FIGS. 5 and 6, the pivot member 25 is arranged below the fixed member 23. The pivot member 25 includes: the pair of left and right large guided members 250L, 250R; the pair of left and right small guided members 252L, 252R; a pivot-side base member 254; four stoppers 255L, 255R; an upper squeegee fixing piece 256; a lower squeegee fixing piece 257; a large guided portion scale 258R; and a small guided portion scale 259R. The large guided portion scale 258R and the small guided portion scale 259R are included in the concept of a scale of the present invention.

The pivot-side base member 254 is made of metal and has the shape of a narrow plate. The pivot-side base member 254 extends in the left-right direction while inclined with respect to the horizontal direction. As illustrated in FIG. 4, the front lower corner portion of the pivot-side base member 254 is formed with a notch portion 260.

As illustrated mainly in FIGS. 4, 6, and 7, the large guided member 250R has the shape of a fan. The large guided member 250R is disposed near the right end of the upper surface of the pivot-side base member 254. The large guided member 250R includes a large guided portion 251R. The large guided portion 251R is included in the concept of a guided portion of the present invention. The large guided portion 251R projects rightward from the upper edge of the large guided member 250R. As illustrated in FIG. 4, the upper surface of the large guided portion 251R is shaped as an arc surface (shaped as a curved surface that projects upward) whose general center is the lower end 280f of the squeegee 28. The lower surface of the large guided portion 251R is shaped as an arc surface (shaped as a curved surface that recesses upward) whose general center is the lower end 280f of the squeegee 28.

As illustrated mainly in FIGS. 4, 6, and 7, the small guided member 252R has the shape of a fan. The small guided member 252R is disposed near the right end of the upper surface of the pivot-side base member 254. The small guided member 252R is provided in series with and rightward of the large guided member 250R. The inner guide piece 231R is interposed unrotatable between the small guided member 252R and the large guided member 250R. The small guided member 252R includes a small guided portion 253R. The small guided portion 253R is included in the concept of the guided portion of the present invention. The small guided portion 253R projects leftward from the upper edge of the small guided member 252R. The upper surface of the small guided portion 253R is shaped as an arc surface (shaped as a curved surface that projects upward) whose general center is the lower end 280f of the squeegee 28. The lower surface of the small guided portion 253R is shaped as an arc surface (shaped as a curved surface that recesses upward) whose general center is the lower end 280f of the squeegee 28. The small guided portion 253R and the large guided portion 251R face each other in the left-right direction. However, the front-rear direction length of the small guided portion 253R is shorter than the front-rear direction length of the large guided portion 251R. The axial portion 242R of the bolt member 239R is interposed between the small guided portion 253R and the large guided portion 251R.

As illustrated mainly in FIG. 4, the large guided portion 251R and the small guided portion 253R can move in the front-rear direction on an arc-like guide path that is formed between the outer guide piece 233R and the inner guide piece 231R. Therefore, the pivot member 25 can pivot in an arc-like track whose general center is the lower end 280f of the squeegee.

As illustrated mainly in FIGS. 6 and 7, the large guided portion scale 258R is disposed on the upper surface of the large guided portion 251R. The small guided portion scale 259R is disposed on the upper surface of the small guided portion 253R.

As illustrated mainly in FIGS. 6 and 7, each of the pair of stoppers 255R is made of metal and has the shape of a round bar. The stopper 255R runs through the small guided portion 253R in the left-right direction, and is in contact with the right surface of the large guided portion 251R. The pair of stoppers 255R is arranged spaced at a predetermined interval in the front-rear direction. The axial portion 242R of the bolt member 239R is interposed between the pair of stoppers 255R. Therefore, the interval of the pair of stoppers 255R determines the maximum pivot distance of the bolt member 239R, that is, the pivot member 25.

The constitutions of the large guided member 250L and the small guided member 252L are similar to the constitutions of the large guided member 250R and the small guided member 252R. The layouts of the large guided member 250L and the small guided member 252L are similar to the layouts of the large guided member 250R and the small guided member 252R.

A large guided portion scale is disposed on the large guided portion 251L. A small guided portion scale is disposed on the small guided portion 253L. In addition, as illustrated in FIG. 5, the pair of stoppers 255L is disposed between the small guided portion 253L and the large guided portion 251L.

As illustrated mainly in FIGS. 4 and 7, the upper squeegee fixing piece 256 is made of metal and has the shape of a narrow plate. The upper squeegee fixing piece 256 is disposed on the notch portion 260 of the pivot-side base member 254. The upper squeegee fixing piece 256 extends in the left-right direction.

As illustrated mainly in FIGS. 4 and 7, the lower squeegee fixing piece 257 is made of metal and has the shape of a narrow plate. The lower squeegee fixing piece 257 is disposed on the lower surface of the pivot-side base member 254. The lower end of the lower squeegee fixing piece 257 and the upper end of the upper squeegee fixing piece 256 face each other in the up-down direction.

<Squeegee 28>

As illustrated mainly in FIGS. 4 and 5, the squeegee 28 is made of metal and has the shape of a thin plate. The squeegee 28 extends in the left-right direction. The squeegee 28 is held between the upper squeegee fixing piece 256 and the lower squeegee fixing piece 257.

[Movement of Screen Printing Machine]

Next, the movement of the screen printing machine 1 according to the present embodiment will be described.

{Movement During Printing}

Figure 8:
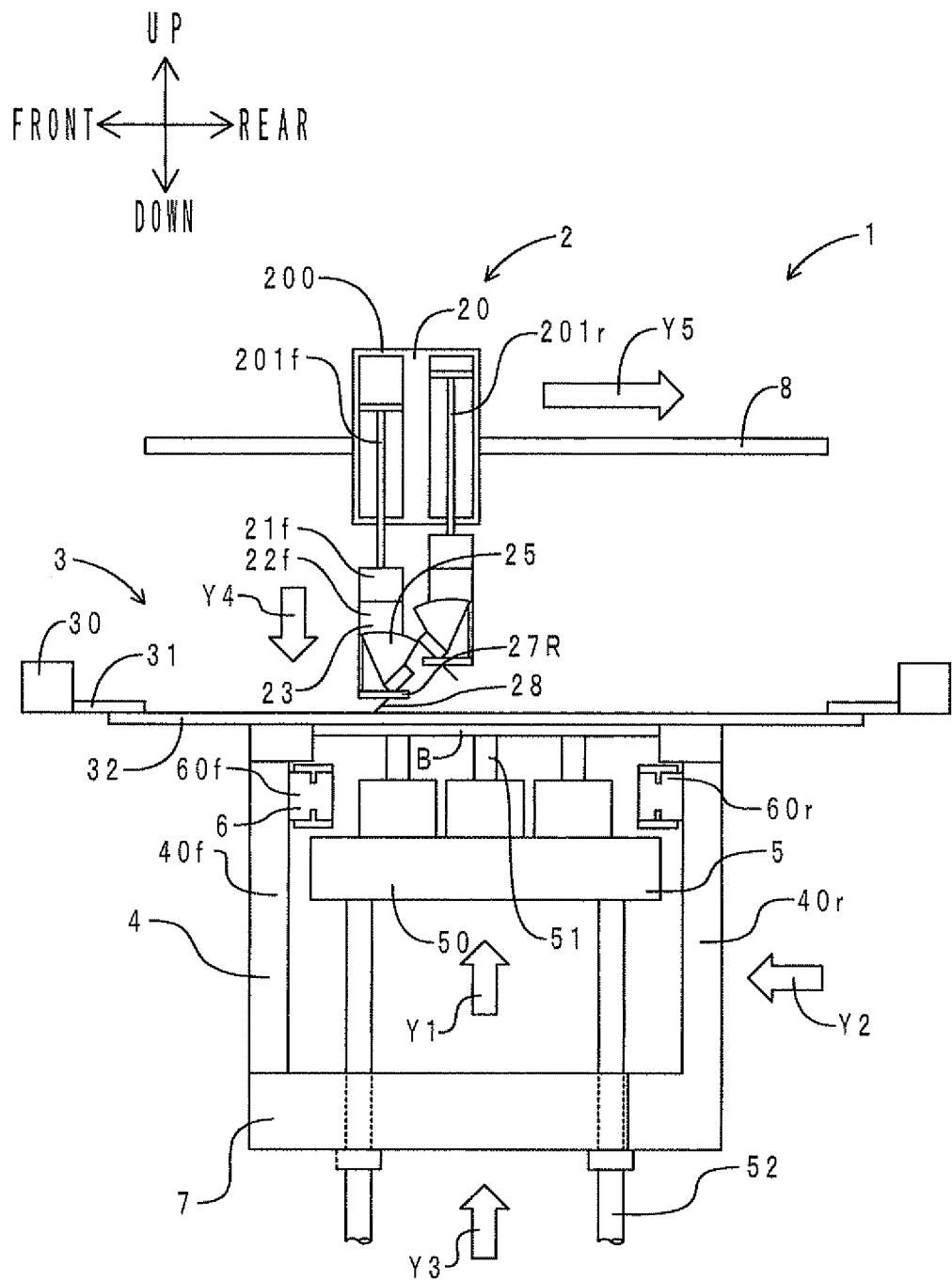
FIG. 8 is a right side view of the screen printing machine during printing.

Next, the movement of the screen printing machine 1 according to the present embodiment during printing will be described. FIG. 8 shows a right side view of the screen printing machine according to the present embodiment during printing. As illustrated in FIGS. 1 and 8, first, the pair of conveyor belts 60f, 60r dispose the circuit board B at a predetermined position above the back-up pin 51.

Next, as indicated by an arrow Y1 in FIG. 8, the back-up table 50 is raised. The plurality of back-up pins 51 then lifts up the circuit board B. The height of the upper surface of the circuit board B and the height of the upper surfaces of the fixed clamp 40f and the movable clamp 40r are subsequently aligned. After that, as indicated by an arrow Y2 in FIG. 8, the movable clamp 40r is moved forward so that the circuit board B is held from the front-rear direction between the fixed clamp 40f and the movable clamp 40r. As indicated by an arrow Y3 in FIG. 8, the back-up table 50, the plurality of back-up pins 51, and the circuit board B are raised together with the main table 7, and the upper surface of the circuit board B comes in contact with the lower surface of the screen mask 32. Next, as indicated by an arrow Y4 in FIG. 8, among the pair of front and rear squeegees 28 of the squeegee device 2, the front squeegee 28 is lowered and pressed into contact with the upper surface of the screen mask 32. Next, as indicated by an arrow Y5 in FIG. 8, the squeegee device 2 is moved in the direction of front to rear along the y-axis guide rail 8. In other words, the squeegee 28 slides on the upper surface of the screen mask 32. A solder (not shown) is arranged on the upper surface of the screen mask 32. The sliding squeegee 28 presses the solder into the pattern holes. The solder pressed into the pattern holes is transferred to a predetermined position on the circuit board B. Note that, as illustrated in FIG. 5, when sliding the squeegee 28, the paste doctor blades 27L, 27R help suppress spreading out of the solder from both sides of the squeegee 28 in the left-right direction.

Thereafter, the squeegee 28 is lifted from the screen mask 32. Next, the circuit board B is lowered with respect to the screen mask 32. In other words, a so-called plate release is performed. The circuit board B is then mounted again on the pair of conveyor belts 60f, 60r. The pair of conveyor belts 60f, 60r are driven again to subsequently send the circuit board B to the downstream side.

Thus, the solder is printed on the circuit board B. Note that, among the pair of front and rear squeegees 28, the rear squeegee 28 is used when the squeegee device 2 is moved in the direction of rear to front, that is, when the solder is printed on the circuit board B in the direction of rear to front.

{Movement During Tooling Change}

Figure 9:
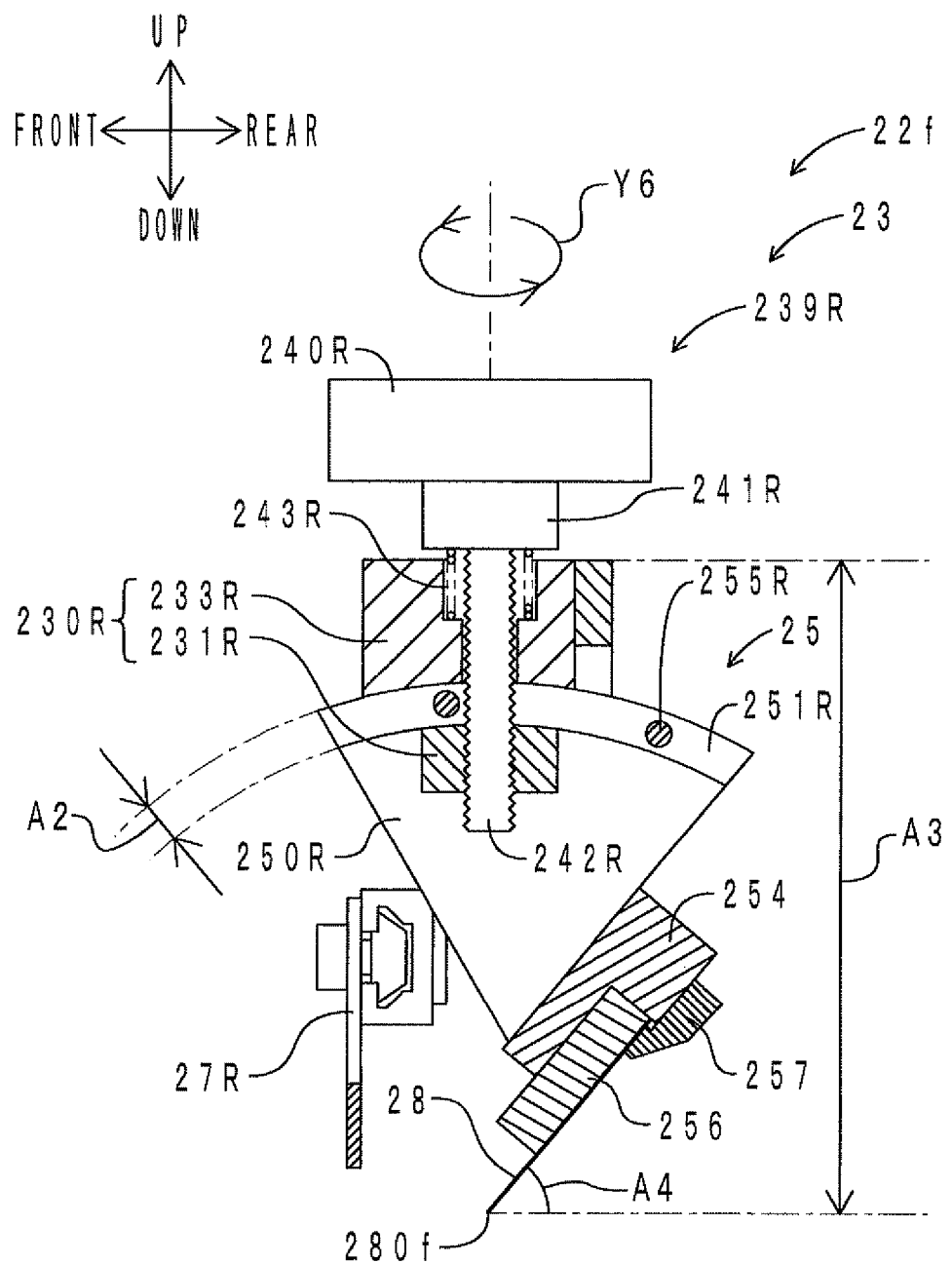
FIG. 9 is a cross-sectional view of the front unit as seen from the right side in a tooling change first stage.
Figure 10:
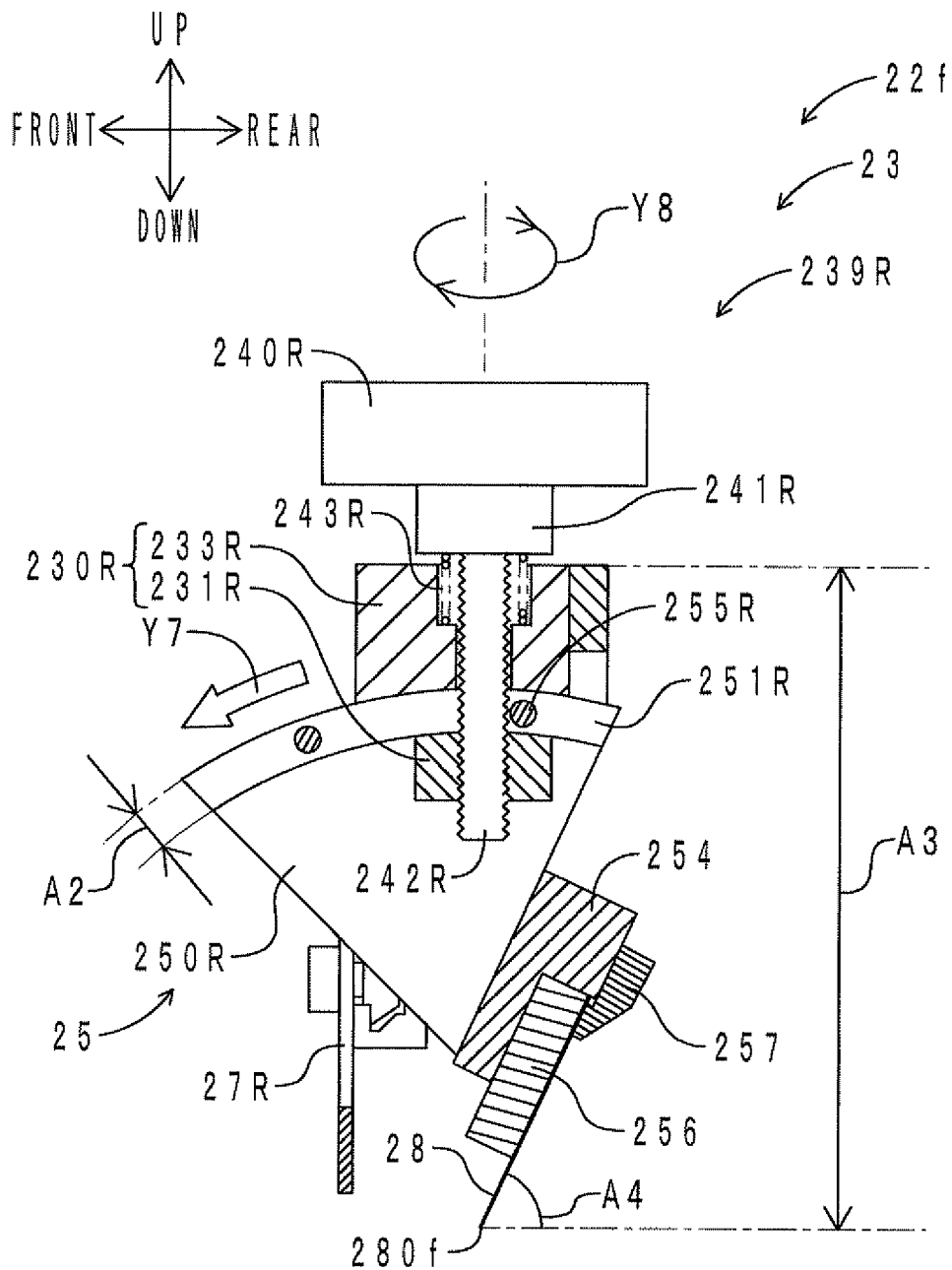
FIG. 10 is a cross-sectional view of the front unit as seen from the right side in a tooling change second stage.

The movement of the screen printing machine 1 of the present embodiment when changing an attack angle of the squeegee 28 during a tooling change will be described. FIG. 9 shows a cross-sectional view of the front unit in the squeegee device of the screen printing machine 1 according to the present embodiment as seen from the right side in a tooling change first stage. FIG. 10 shows a cross-sectional view of the front unit as seen from the right side in a tooling change second stage. Note that the cross sections of FIGS. 9 and 10 are cross sections along the bolt member 239R.

An example in which an attack angle A4 of the squeegee 28 is increased during a tooling change will be described. First, as indicated by an arrow Y6 in FIG. 9, the operator turns the knob 240R. This rotates the bolt member 239R. Here, as illustrated in FIG. 7, the rotation of the inner guide piece 2318 is restricted by the right surface of the large guided member 250R and the left surface of the small guided member 252R. Therefore, when the operator turns the knob, the inner guide piece 231R does not rotate and only the bolt member 239R is rotated.

Returning to FIG. 9, when the bolt member 239R rotates, the interval between the inner guide piece 231R and the head portion 241R of the bolt member 239R becomes wider. Therefore, due to the weight of the pivot member 25, the pivot member 25 and the inner guide piece 231R almost start to lower. However, the biasing force of the coil spring 243R pushes up the head portion 241R of the bolt member 239R from the outer guide piece 233R. Therefore, the pivot member 25 and the inner guide piece 231R do not lower. Thus, the large guided portion 251R and the small guided portion 253R (see FIG. 7) are also not lowered. Accordingly, the width of a guide path A2 between the outer guide piece 233R and the inner guide piece 231R does not change. Note that the operator manipulates the bolt member 239L in the same manner as the bolt member 239R.

Next, as indicated by an arrow Y7 in FIG. 10, the operator pivots the pivot member 25. At such time, the large guided portion 251R and the small guided portion 253R follow the guide path A2 between the outer guide piece 233R and the inner guide piece 231R. Here, the lower surface of the outer guide piece 233R, the upper surface of the inner guide piece 231R, the upper and lower surfaces of the large guided portion 251R, and the upper and lower surfaces of the small guided portion 253R are each shaped as an arc surface whose general center is the lower end 280f of the squeegee 28. Therefore, the pivot member 25 pivots in an arc-like track whose general center is the lower end 280f of the squeegee 28.

Thereafter, as shown in FIG. 6, the operator looks from above at the large guided portion scale 258R and the small guided portion scale 259R. The attack angle A4 is shown on the large guided portion scale 258R and the small guided portion scale 259R. Once the desired attack angle A4 shown on the large guided portion scale 258R and the small guided portion scale 259R aligns with the front surface of the outer guide piece 233R, the operator stops pivoting the pivot member 25.

After that, the operator turns the knob 240R in a direction indicated by an arrow Y8 in FIG. 10 (a direction opposite to the direction of the arrow Y9 in FIG. 9). The coil spring 243R contracts and accumulates a biasing force. Utilizing the fastening force of the bolt member 239R with respect to the inner guide piece 231R, the large guided portion 251R and the small guided portion 253R are held from the up-down direction between the outer guide piece 233R and the inner guide piece 231R. Note that the operator manipulates the bolt member 239L in the same manner as the bolt member 239R.

In this manner, the attack angle A4 is increased. The operation to decrease the attack angle A4 is the same as the operation described above. In addition, the operation to change the attack angle A4 of the squeegee 28 of the rear unit 22r is the same as the operation described above.

[Operation and Effects]

Next, the operation and effects of the screen printing machine 1 according to the present embodiment will be described. According to the squeegee device 2 of the screen printing machine 1 of the present embodiment, the attack angle A4 of the squeegee 28 can be adjusted during the tooling change instead of during the printing operation. Further, according to the squeegee device 2 of the present embodiment, there is no need to perform replacement work for a squeegee holder when adjusting the attack angle A4. Therefore, adjustment work for the attack angle A4 can be easily performed.

According to the squeegee device 2 of the screen printing machine 1 of the present embodiment, the positions of the lower ends 280f, 280r of the squeegees 28 in the front-rear direction generally do not change before and after adjustment. In addition, as illustrated in FIGS. 9 and 10, an up-down distance A3 from the lower ends 280f, 280r to the upper surfaces of the outer guide pieces 233L, 233R, i.e., the positions of the lower ends 280f, 280r in the up-down direction, generally does not change. Therefore, it is not necessary to reset the movement track of the squeegee device 2 in the front-rear direction, or the lowering amounts of the front unit 22f and the rear unit 22r, or the like. Therefore, work accompanying the adjustment work for the attack angle A4 can be easily performed.

The squeegee device 2 of the screen printing machine 1 according to the present embodiment includes the pair of front and rear squeegees 28 as illustrated in FIG. 4. When adjusting the attack angle A4, a change in the positions of the lower ends 280f, 280r of the squeegees in the front-rear direction before and after adjustment changes an interval A1 between the pair of lower ends 280f, 280r. Therefore, the movement track of the squeegee device 2 in the front-rear direction must be reset. With regard to this point, however, according to the squeegee device 2 of the screen printing machine 1 of the present embodiment, the positions of the lower ends 280f, 280r of the squeegees 28 in the front-rear direction generally do not change before and after adjustment. Therefore, it is not necessary to reset the movement track of the squeegee device 2 in the front-rear direction. Thus, work accompanying the adjustment work for the attack angle A4 of the squeegee 28 can be easily performed.

According to the squeegee device 2 of the screen printing machine 1 of the present embodiment, as illustrated in FIGS. 9 and 10, by using the guide portion 230R to guide the large guided portion 251R and the small guided portion 253R, the squeegees 28 can be pivoted generally around the lower ends 280f, 280r. Likewise, as illustrated in FIG. 5, by using the guide portion 230L to guide the large guided portion 251L and the small guided portion 253L, the squeegees 28 can be pivoted generally around the lower ends 280f, 280r. Therefore, it is not necessary to dispose a pivot shaft on the lower ends 280f, 280r of the squeegees 28.

According to the squeegee device 2 of the screen printing machine 1 of the present embodiment, as illustrated in FIG. 8, the position of the squeegee 28 in the up-down direction, i.e., the pressing force of the squeegee 28 with respect to the solder and the screen mask 32, can be adjusted using the air cylinder 20. Likewise, the attack angle A4 of the squeegee 28 can be adjusted using the guide portions 230L, 230R, the large guided portions 251L, 251R, and the small guided portions 253L, 253R. Therefore, the pressing force of the squeegee 28 and the attack angle A4 of the squeegee 28 can be independently adjusted.

According to the squeegee device 2 of the screen printing machine 1 of the present embodiment, as illustrated in FIGS. 6 and 7, a pair of large guided portion scales 258R is disposed on the upper surfaces of the large guided portions 251L, 251R. Likewise, a pair of small guided portion scales 259R is disposed on the upper surfaces of the small guided portions 253L, 253R. The attack angle A4 is shown on the large guided portion scale 258R and the small guided portion scale 259R. Therefore, the operator can easily confirm the attack angle A4 of the squeegee 28 from above. Further, the operator can accurately set the attack angle A4 of the squeegee 28.

According to the squeegee device 2 of the screen printing machine 1 of the present embodiment, the paste doctor blades 27L, 27R are disposed on the fixed member 23 as illustrated in FIG. 5. Even if the attack angle A4 of the squeegee changes, the angle of the fixed member 23 stays the same. Therefore, during a tooling change, changing the attack angle A4 of the squeegee 28 does not lead to a need to adjust the inclination angles of the paste doctor blades 27L, 27R with respect to the screen mask 32. Likewise, even if the attack angle A4 of the squeegee 28 is changed, there is no need to retool the paste doctor blades 27L, 27R.

According to the squeegee device 2 of the screen printing machine 1 of the present embodiment, as illustrated in FIGS. 9 and 10, the large guided portion 251R and the small guided portion 253R are guided from both inner and outer sides in the radial direction of virtual arcs whose general centers are the lower ends 280f, 280r by the outer guide piece 233R and the inner guide piece 231R. Similarly, as illustrated in FIG. 5, the large guided portion 251L and the small guided portion 253L are guided from both inner and outer sides in the radial direction of virtual arcs whose general centers are the lower ends 280f, 280r by the outer guide piece 233L and the inner guide piece 231L. Therefore, the tracks of the large guided portions 251L, 251R, and the small guided portions 253L, 253R are easy to stabilize when changing the attack angle A4 of the squeegee 28.

According to the squeegee device 2 of the screen printing machine 1 of the present embodiment, as illustrated in FIGS. 9 and 10, even if the interval between the head portion 241R of the bolt member 239R and the inner guide piece 231R is widened by turning the bolt member 239R, the biasing force of the coil spring 243R pushes up the head portion 241R of the bolt member 239R from the outer guide piece 233R. Therefore, the width of the guide path A2 between the outer guide piece 233R and the inner guide piece 231R does not change. Based on this as well, the tracks of the large guided portions 251L, 251R, and the small guided portions 253L, 253R are easy to stabilize when changing the attack angle A4 of the squeegee 28.

In addition, when changing the attack angle A4 of the squeegee 28, the large guided portion 251R and the small guided portion 253R are in sliding contact with the outer guide piece 233R and the inner guide piece 231R. Similarly, as illustrated in FIG. 5, the large guided portion 251L and the small guided portion 253L are in sliding contact with the outer guide piece 233L and the inner guide piece 231L. At such time, the biasing force of the coil spring 243R acts as suitable slide resistance. This facilitates work to change the attack angle A4.

Even after changing the attack angle A4, the biasing force of the coil spring 243R is applied to the pivot member 25. Therefore, the pivot member 25 is less susceptible to moving when tightening the bolt member 239R. Accordingly, the attack angle A4 once set is less susceptible to misalignment.

According to the squeegee device 2 of the screen printing machine 1 of the present embodiment, as illustrated in FIGS. 9 and 10, even if the interval between the head portion 241R of the bolt member 239R and the inner guide piece 231R is widened by turning the bolt member 239R, the upper surface of the large guided portion 251R and the upper surface of the small guided portion 253R remain in contact with the lower surface of the outer guide piece 233R due to the biasing force of the coil spring 243R (see FIG. 6). Therefore, the operator is less susceptible to error when visibly comparing the desired attack angle A4 shown on the large guided portion scale 258R and the small guided portion scale 259R against the front surface of the outer guide piece 233R. Accordingly, the operator can accurately set the attack angle A4 of the squeegee 28.

According to the squeegee device 2 of the screen printing machine 1 of the present embodiment, the stoppers 255L, 255R are disposed on the pivot member 25 as illustrated in FIG. 5. Therefore, as FIGS. 9 and 10 show, the maximum pivot distance of the pivot member 25 can be restricted. It is also possible to suppress detachment of the pivot member 25 from the fixed member 23.

According to the squeegee device 2 of the screen printing machine 1 of the present embodiment, the paste doctor blades 27L, 27R are attached to the doctor attachment rail 245 as illustrated in FIG. 5. Therefore, the positions of the paste doctor blades 27L, 27R in the left-right direction can be freely adjusted along the doctor attachment rail 245.

According to the squeegee device 2 of the screen printing machine 1 of the present embodiment, as illustrated in FIG. 4, the large guided members 250L, 250R and the small guided members 252L, 252R are disposed so as to line up in the front-rear direction in the front unit 22$f$ and the rear unit 22$r$. Therefore, when changing the attack angle A4, the pair of front and rear pivot members 25 are less susceptible to interference from one another compared to when the large guided members 250L, 250R are both lined up in the front-rear direction.

According to the squeegee device 2 of the screen printing machine 1 of the present embodiment, a plurality of attack angles A4 can be achieved with a single pivot member 25. There is thus no need to prepare a plurality of types of pivot members 25 depending on the plurality of attack angles A4. This reduces the number of parts of the squeegee device 2 accordingly.

<<Second Embodiment>>

A squeegee device and a screen printing machine according to a second embodiment differ from the squeegee device and the screen printing machine according to the first embodiment in that the scales for confirming the attack angle are disposed on both the fixed member and the pivot member. Only these points of difference will be explained here.

Figure 11:
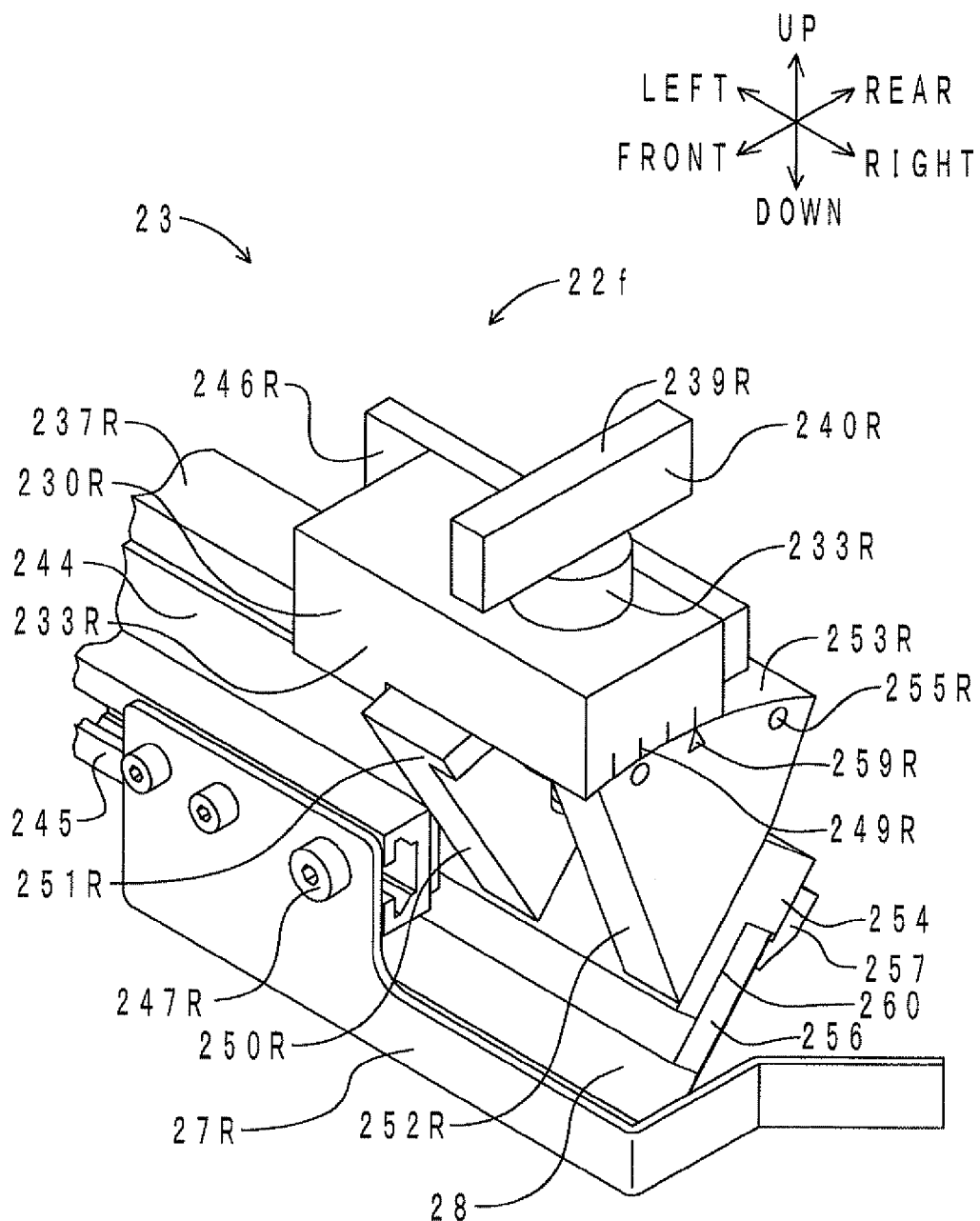
FIG. 11 is a perspective view of the vicinity of the right end portion of the front unit in the squeegee device of the screen printing machine according to a second embodiment.

FIG. 11 shows a perspective view of the vicinity of the right end portion of the front unit in the squeegee device of the screen printing machine according to the present embodiment. Note that areas corresponding to those in FIG. 6 are indicated by identical reference numerals. As illustrated in FIG. 11, the small guided portion scale 259R is disposed on the upper edge of the right surface of the small guided portion 253R. Meanwhile, an outer guide piece scale 249R is disposed on the lower edge of the right surface of the outer guide piece 233R. The attack angle is shown on the outer guide piece scale 249R. The outer guide piece scale 249R and the small guided portion scale 259R face each other in the up-down direction. During a tooling change, the operator can set the attack angle by aligning the outer guide piece scale 249R that indicates a desired attack angle and the small guided portion scale 259R in the up-down direction.

Note that the left end portion of the front unit 22$f$ is also provided with an outer guide piece scale and a large guided portion scale so that the left end portion and the right end portion are generally symmetrical in the left-right direction. In other words, referring to FIG. 5, in the case of the left end portion, the large guided portion scale is disposed on the upper edge of the left surface of the large guided portion 251L. Further, the outer guide piece scale, the small guided portion scale, and the large guided portion scale are also disposed on the rear unit.

The squeegee device and the screen printing machine according to the present embodiment have the same operation and effects as the squeegee device and the screen printing machine according to the first embodiment with respect to portions that the constitutions of the first and second embodiments have in common. Further, according to the squeegee device and the screen printing machine of the present embodiment, the operator can easily confirm the attack angle from the left-right direction.

<<Other Embodiments>>

Embodiments of the squeegee device and the screen printing machine according to the present invention are described above. However, the embodiments of the present invention are not particularly limited to the modes described above; various modifications and improvements may also be implemented by a person having ordinary skill in the art.

For example, in order to pivot the pivot member 25 generally around the lower ends 280$f$, 280$r$ of the squeegees 28, a pin may be provided on one of the fixed member 23 and the pivot member 25 and a guide groove with an arc shape in which the pin slides may be provided on the other of the fixed member 23 and the pivot member 25.

In addition, the lower surfaces of the outer guide pieces 233L, 233R, the upper surfaces of the large guided portions 251L, 251R, and the upper surfaces of the small guided portions 253L, 253R may be formed with unevenness. The pitch of the unevenness may correspond to the attack angle A4 with a high frequency of use. The attack angle A4 can thus be easily set because there is a sense of moderation (change in pivot resistance) when the pivot member 25 is pivoted.

Further, in the course of changing the attack angle A4, the pivot member 25 need not move in an arc-like track whose general center is the lower ends 280$f$, 280$r$ of the squeegees 28. In other words, the pivot member 25 need not move in such an arc-like track provided that the positions of the lower ends 280$f$, 280$r$ of the squeegees 28 in the front-rear direction and the up-down direction are generally the same before and after the change. Also, clips, pins, or the like may be used instead of the bolt members 239L, 239R in order to maintain the predetermined attack angle A4. As the lifting/lowering member of the present invention, in place of the air cylinder 20, another fluid cylinder such as a hydraulic cylinder, a ball screw mechanism, or the like may be used.

The movement direction of the squeegee 28 may also be the left-right direction. Further, the squeegee device of the present invention may also be practiced as a so-called single squeegee type of squeegee device 2 that has only one squeegee 28.

What is claimed is:
1. A squeegee device, comprising:
at least one squeegee with an adjustable attack angle, having a sliding contact portion that is in sliding contact with a screen mask, and printing a solder on a circuit board through the screen mask, wherein
when adjusting the attack angle during a tooling change in which a type of the circuit board is changed, positions of the sliding contact portion before and after adjustment substantially match;
a pivot member that holds the squeegee and has a guided portion; and a fixed member that has a bolt member and a guide portion, wherein the guide portion 1) forms an arc-shaped track generally centered around the sliding contact portion of the squeegee, and 2) guides the guided portion in the arc-shaped track, the guide portion has an outer guide piece that guides the guided portion from a radial outer side, and an inner guide piece that guides the guided portion from a radial inner side, generally centered around the sliding contact portion of the squeegee, the outer guide piece and the inner guide piece are disposed independently of each other, the bolt member is configured to be manually rotated by an operator and includes a head portion and an axial portion, the head portion is disposed radially outward of the outer guide piece, and the axial portion runs through the outer guide piece in a radial direction and is fastened to the inner guide piece.

2. The squeegee device according to claim 1, further comprising:
a lifting/lowering member that can lift and lower the pivot member and the fixed member.

3. The squeegee device according to claim 2, wherein
at least one among the pivot member and the fixed member has a scale that one of directly and indirectly shows the attack angle.

4. The squeegee device according to claim 2, further comprising:
a paste doctor blade that is disposed on the fixed member, and during printing suppresses spreading out of the solder to an outer side from both ends of the squeegee in a lengthwise direction.

5. A screen printing machine, comprising:
a squeegee device according to claim 1.

6. The squeegee device according to claim 1, wherein
the outer guide piece has an uneven lower surface and the guided portion has an uneven upper surface.

* * * * *